United States Patent
Annema et al.

(10) Patent No.: US 10,250,266 B2
(45) Date of Patent: Apr. 2, 2019

(54) OSCILLATOR CALIBRATION SYSTEM

(71) Applicant: NXP B.V., Eindhoven (NL)

(72) Inventors: Anne-Johan Annema, Hengelo (NL); Jos Verlinden, Wachtendonk (DE)

(73) Assignee: NXP B.V., Eindhoven (NL)

( * ) Notice: Subject to any disclaimer, the term of this patent is extended or adjusted under 35 U.S.C. 154(b) by 113 days.

(21) Appl. No.: 15/657,250

(22) Filed: Jul. 24, 2017

(65) Prior Publication Data
US 2019/0028106 A1 Jan. 24, 2019

(51) Int. Cl.
H03L 7/083 (2006.01)

(52) U.S. Cl.
CPC .................................... H03L 7/083 (2013.01)

(58) Field of Classification Search
CPC ....................................................... H03L 7/083
USPC ........................................................... 331/18
See application file for complete search history.

(56) References Cited

U.S. PATENT DOCUMENTS

| | | | |
|---|---|---|---|
| 5,994,967 A | 11/1999 | Nguyen | |
| 6,353,368 B1 | 3/2002 | Iravani | |
| 8,994,459 B2 | 3/2015 | Patasani et al. | |
| 2002/0041217 A1* | 4/2002 | Crofts | H03K 3/0231 331/175 |
| 2009/0146746 A1 | 6/2009 | Unkrich et al. | |
| 2010/0225406 A1 | 9/2010 | Shikata | |
| 2010/0231307 A1 | 9/2010 | Walley | |
| 2010/0271139 A1 | 10/2010 | Shikata | |
| 2011/0175666 A1 | 7/2011 | Ballenegger | |
| 2012/0306580 A1 | 12/2012 | Ellis | |
| 2013/0021105 A1 | 1/2013 | Leoncavallo | |
| 2013/0082784 A1 | 4/2013 | Chiu et al. | |
| 2015/0180483 A1 | 6/2015 | Astrom et al. | |
| 2016/0026209 A1 | 1/2016 | Leme et al. | |
| 2017/0307668 A1* | 10/2017 | Buffa | G01R 27/2605 |

OTHER PUBLICATIONS

Choi, M., "A 110 nW Resistive Frequency Locked On-Chip Oscillator with 34.3 ppm/° C. Temperature Stability for System-on-Chip Designs", IEEE Journal of Solid-State Circuits, vol. 51, No. 9, Sep. 2016.
Abidi, A., "Linearization of Voltage-Controlled Oscillators Using Switched-Capacitor Feedback"; IEEE Journal of Solid-Statecircuits, vol. SC-22, No. 3, Jun. 1987.
Choe, K., "A precision relaxation oscillator with a self-clocked offset-cancellation scheme for implantable biomedical SoCs," ISSCC Dig. Tech. Papers, pp. 402-403, Feb. 2009.

(Continued)

Primary Examiner — Joseph Chang
(74) Attorney, Agent, or Firm — David G. Dolezal

(57) ABSTRACT

An oscillator system for an integrated circuit includes a first oscillator circuit, a second oscillator circuit, and calibration system. During a sampling routine, the calibration system is used to determine a sampled value based on a comparison of the output of the second oscillator and an external clock signal. The sampled value is stored in a memory. During a calibration routine, the calibration system determines a comparison value based on a comparison of the output of the second oscillator circuit and the output of the first oscillator circuit. The calibration circuit compares the comparison value with the sampled value to generate a tuning value to tune the frequency of the first oscillator circuit.

20 Claims, 4 Drawing Sheets

(56) References Cited

OTHER PUBLICATIONS

Denier, U., "Analysis and Design of an Ultralow-Power CMOS Relaxation Oscillator," IEEE Transactions on Circuits and Systems I: Regular Papers, vol. 57, No. 8, pp. 1973,1982, Aug. 2010.
Griffith, D., "190nW 33kHz RC oscillator with ±0.21% temperature stability and 4ppm long-term stability," IEEE International Solid-State Circuits Conference Digest of Technical Papers (ISSCC), pp. 300-301, Feb. 2014.
Hsiao, Keng-Jan, "A 32.4 ppm/° C. 3.2-1.6V self-chopped relaxation oscillator with adaptive supply generation," Proc. VLSI Symposium, pp. 14-15, Jun. 2012.
Kashmiri, S.M., "A scaled thermal-diffusivity-based frequency reference in 0.16μm CMOS," Proceedings of the ESSCIRC, pp. 503,506, Sep. 2011.
Kugelstadt, T., "Auto-zero amplifiers ease the design of high-precision circuits", Analog Applications Journal, 2Q 2005.
Le, NPT, "High Linearity Voltage-Controlled Oscillator", Department of Electrical and Computer Engineering, Faculty of Engineering, National University of Singapore, IEEE 2009.
Lee, J., "4.7MHz 53μW fully differential CMOS reference clock oscillator with -22dB worst-case PSNR for miniaturized SoCs,", ISSCC Dig. Tech. Papers vol. , pp. 13, Feb. 2015.
McCorquodale, M.S., "A Silicon Die as a Frequency Source", IEEE International Frequency Control Symposium, Jun. 2010.
Paidimarri, A., "A 120nW 18.5kHz RC oscillator with comparator offset cancellation for ±0.25% temperature stability," ISSCC, pp. 184-185, Feb. 2013.
Sebastiano, F., "A 65-nm CMOS temperature-compensated mobility-based frequency reference for wireless sensor networks," in Proc. ESSCIRC, 2010, pp. 102-105.
Ueno, K., "A 30-MHz, 90-ppm/° C. fully-integrated clock reference generator with frequency-locked loop," Proc. ESSCIRC, pp. 392-395, Sep. 2009.
Notice of Allowance dated Feb. 6, 2019 in U.S. Appl. No. 15/657,255.

* cited by examiner

OSCILLATOR CALIBRATION SYSTEM

BACKGROUND OF THE INVENTION

Field of the Invention

This invention relates in general to an oscillator circuit, and more specifically for a system for calibrating an oscillator circuit.

Description of the Related Art

Oscillators are used by electronic systems for providing clock signals or other alternating signals at a particular frequency. The output of some types of oscillators can be tuned to adjust the frequency of the output to a desired frequency.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
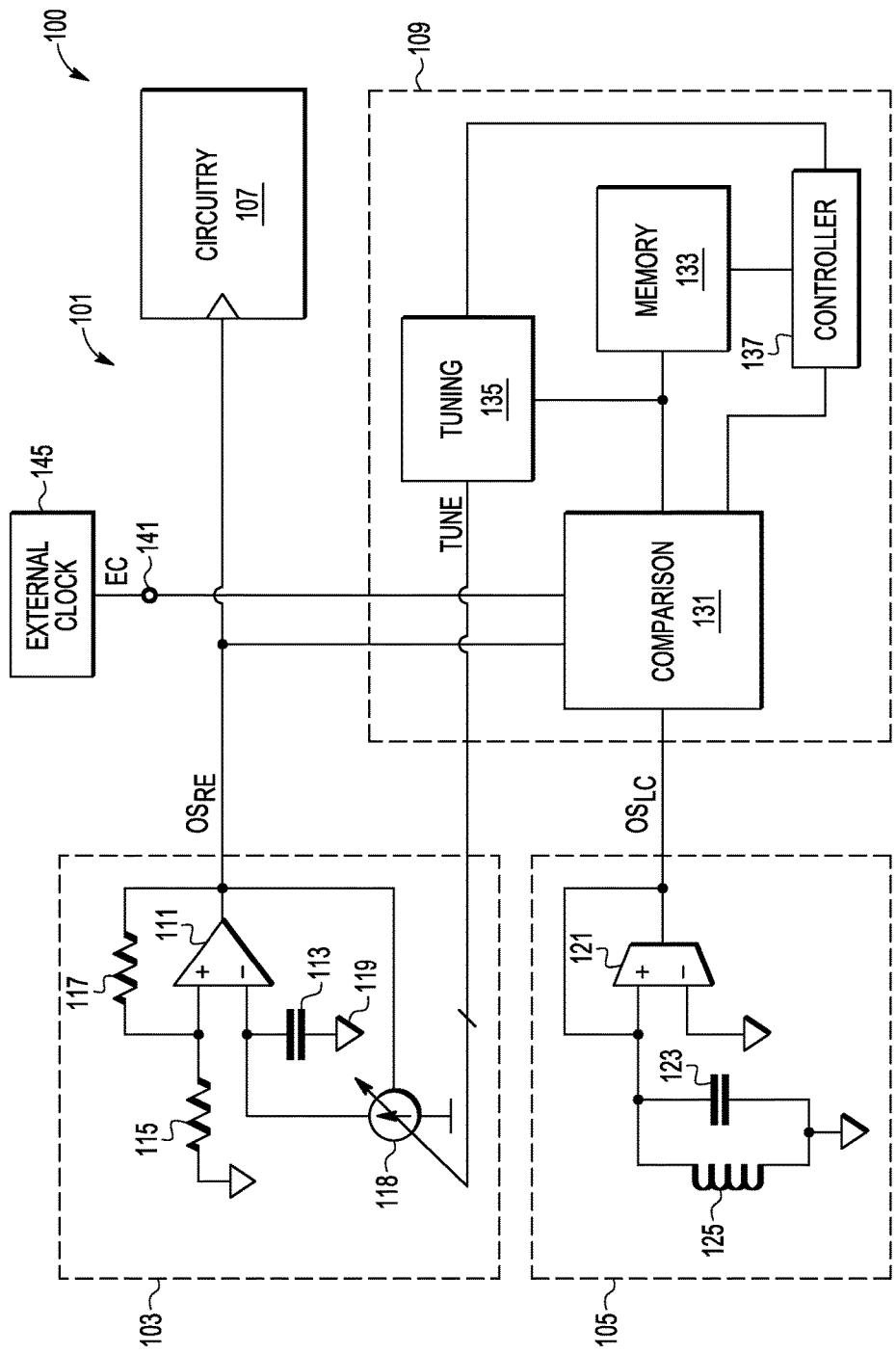
FIG. 1 is a circuit diagram of a system for providing an oscillator signal according to one embodiment of the present invention.

The following sets forth a detailed description of a mode for carrying out the invention. The description is intended to be illustrative of the invention and should not be taken to be limiting.

As disclosed herein, an oscillator system that includes a first oscillator circuit, a second oscillator circuit, and calibration system. During a sampling routine, the calibration system is used to determine a sampled value based on a comparison of the output of the second oscillator circuit and an external clock signal. The sampled value is stored in a memory. During a calibration routine, the calibration system determines a comparison value based on a comparison of the output of the second oscillator circuit and the output of the first oscillator circuit. The calibration circuit compares the comparison value with the sampled value to generate a tuning value to tune the frequency of the first oscillator circuit. Accordingly, with at least some embodiments of a calibration system described herein, a first oscillator circuit of an integrated circuit can be calibrated with a second oscillator circuit and a sampled value that was generated with an external clock signal without the external clock signal being coupled to the integrated circuit.

Accurate frequency references are desired in many electronic systems to achieve proper timing and synchronization. In some embodiments, its desirable to provide an oscillator output at a frequency that is accurate to within 0.1% over PVT-L&M (Process, Voltage, Temperature, —Lifetime & Mechanical stress) variation. External clock sources such as external crystal oscillators can provide an accurate frequency reference. However, including such external clock sources can increase the cost, space requirements, and manufacturing complexity of an electronic system.

To reduce cost and space requirements, some electronic systems utilize free-running oscillator circuits (FRO) in an integrated circuit device that are not locked to an external clocking signal. In many applications, it is desirable for a FRO to be cost effective to implement and consume a low amount of power during operation. One type of oscillator that may be used as an FRO is a relaxation oscillator. A relaxation oscillator is an oscillator that switches to and from at least one specific state periodically.

To provide a desired frequency, an FRO is typically calibrated with an external clock signal during manufacture of the integrated circuit or during the manufacture the electronic system. As part of the calibration process, trim values are determined and stored in the FRO to adjust the output of the FRO to a desired frequency during use of the integrated circuit.

Although some relaxation oscillators may be more power efficient than other oscillators, some relaxation oscillators typically are not as frequency stable (e.g. from a PVL-T&M standpoint) as other types of oscillators such as LC based oscillators or thermal diffusivity based oscillators. Some relaxation oscillators such as resistor capacitor (RC) oscillators inherently use resistors and/or (in some examples) voltage controlled current sources which can affect their frequency stability from a PVL-T&M standpoint. For example, due to effects like dopant (de)activation and hydrogen release, poly resistors may exhibit considerable ageing effects that prevent them from being used in oscillators having a high frequency accuracy requirement (e.g. 0.1% accuracy). Using MOS transistors as either resistors or current sources requires very good modelling or very good compensation of the heavily non-linear temperature dependencies of both the carrier-mobilities and threshold voltages of a MOS transistor to be able to reach a high accuracy requirement. Because the frequency of an RC oscillator can vary over its lifetime due to the above described effects, an RC oscillator or other relaxation oscillator calibrated at manufacture may not meet the desired accuracy requirements over its lifetime.

LC based oscillators generally are considered much more frequency stable as compared to relaxation oscillators. An LC based oscillator is an oscillator circuit where an inductor-capacitor tank circuit is used to define the oscillating frequency. Examples of LC based oscillators include LC oscillators, LCR (inductor capacitor resistor) oscillators, or a mechanical or optical equivalents such as SAW oscillators. However, at some desired frequency ranges such as in the GHz range, some LC based oscillators have a relatively high power consumption. Furthermore, the capacitors and inductors needed for lower frequency LC oscillators may require an undesirable amount of area on an integrated circuit. In addition, some LC based oscillators employ capacitances that are temperature dependent and are prone to exhibit aging effects. Furthermore, electromagnetic disturbances may cause a change in the inductance of the LC tank circuit.

With some embodiments of the present invention, a sampled value can be generated from comparing the output of a more frequency stable oscillator circuit and an external clock. The sampled value can be stored in a memory of the integrated circuit. In some embodiments, this process is carried out during or after manufacture. Afterwards, a more power efficient oscillator (e.g. a relaxation oscillator) can be calibrated at particular times over its lifetime by using the sampled value and the output of the frequency stable oscillator to generate a tune value for tuning the frequency of the power efficient oscillator to the desired frequency. As the relaxation oscillator circuit ages, the tune value is adjusted to meet frequency accuracy requirements without having to use an external clock signal. Accordingly, with some embodiments of such a system, an FRO can be implemented on an integrated circuit that meets frequency accuracy requirements over the life of the integrated circuit.

FIG. 1 is a circuit diagram of an oscillator system 101 of an integrated circuit 100 that is used to generate an oscillation signal ($OS_{RE}$) at a frequency ($F_{RE}$) to circuitry 107 of the integrated circuit 100. Circuitry 107 can be any type of circuitry of an integrated circuit (e.g. processor, memory, sensors, digital logic, analog circuitry, analog to digital converters, microcontroller, transceivers) that uses an oscillator signal for its operation (e.g. as a clocking signal). Oscillator system 101 includes an oscillator circuit 103, which in the embodiment shown, is an RC relaxation oscillator circuit. In the embodiment shown, oscillator circuit 103 includes an amplifier 111, a capacitor 113, resistors 115 and 117, and a voltage controlled current source 118. Resistors 115 and 117 are each connected to the non-inverting input of amplifier 111 and capacitor 113 and voltage controlled current source 118 are connected to the inverting input of amplifier 111. In the embodiment shown, the current from voltage controlled current source 118 is controlled by the output of amplifier 111 to produce oscillations at the output of amplifier 111. Voltage controlled current source 118 is also adjustable by a digital tuning signal (Tune) from a tuning circuit 135 to control the response of a change in current from a change in output voltage of amplifier 111. Accordingly, the frequency of oscillator circuit 103 can be adjusted by the Tune signal.

System 101 also includes an LC oscillator circuit 105 having an operational transconductance amplifier (OTA) 121 with its inverting input connected to ground and its non-inverting input connected to an inductor capacitor (LC) tank that includes inductor 125 and capacitor 123. Amplifier 121 provides positive feedback to keep the LC tank in oscillation, generating a frequency at the output ($OS_{LC}$) of oscillator circuit 105.

System 101 includes a calibration system 109 that includes a comparison circuit 131, a tuning circuit 135, a memory 133, and a controller 137. The comparison circuit 131 includes inputs for receiving the oscillating signal ($OS_{RE}$) from the oscillator circuit 103, an input for receiving the output ($OS_{LC}$) of oscillator circuit 105, and an input coupled to integrated circuit terminal 141 for receiving an external clock signal (EC) from external clock 145, which is external to integrated circuit 100. In a sampling mode, comparison circuit 131 compares the output of oscillator circuit 105 with the external clock signal from clock 145 (e.g. during manufacture or assembly) and generates a sampled value that is stored in memory 133. During a calibration mode, comparison circuit 131 compares the output of oscillator circuit 103 with the output of oscillator circuit 105 to generate a comparison value. The comparison value and the sampled value in memory 133 are used by the tuning circuit 135 to generate the Tune value to adjust the frequency of the output of oscillator circuit 103 to a desired frequency.

System 109 also includes a controller for controlling the operations of system 109 including controlling the operations when in a sampling mode and in a calibration mode. Memory 133 is a nonvolatile memory in some embodiments, such as a flash memory, MRAM memory, EEPROM, ROM, or a set of fuses or other one time programmable memory.

In other embodiments, oscillator circuits 103 and 105 each can have other configurations and/or be of other types of oscillator circuits. For example, oscillator circuit 103 can be another type of RC oscillator circuit, another type of relaxation oscillator circuit, a lower power LC oscillator circuit, or a harmonic oscillator circuit. In one embodiment, circuit 103 can be relaxation oscillator circuit described in US patent application entitled "Oscillator System," having the same assignee, and being filed concurrently with this application, all of which is incorporated by reference in its entirety. Oscillator circuit 105 can be another type of oscillator circuit such as e.g. another type of LC based oscillator circuit, a harmonic oscillator circuit, or a MEMS resonator. In some embodiments, oscillator circuit 103 consumes less power (lower power) than oscillator circuit 105 during operation. In some embodiments, oscillator circuit 105 is more frequency stable over its lifetime than oscillator circuit 103.

It is preferable in some embodiments that oscillator circuit 105 be largely independent of mobility and threshold voltage, process and temperature dependencies, and largely independent of degradation effects. It is also preferable in some embodiments that oscillator circuit 105 be largely insensitive to EM near field issues and mechanical packaging and mounting stress issues. It is also desirable in some embodiments for oscillator circuit 105 to be fairly frequency stable.

Figure 2:
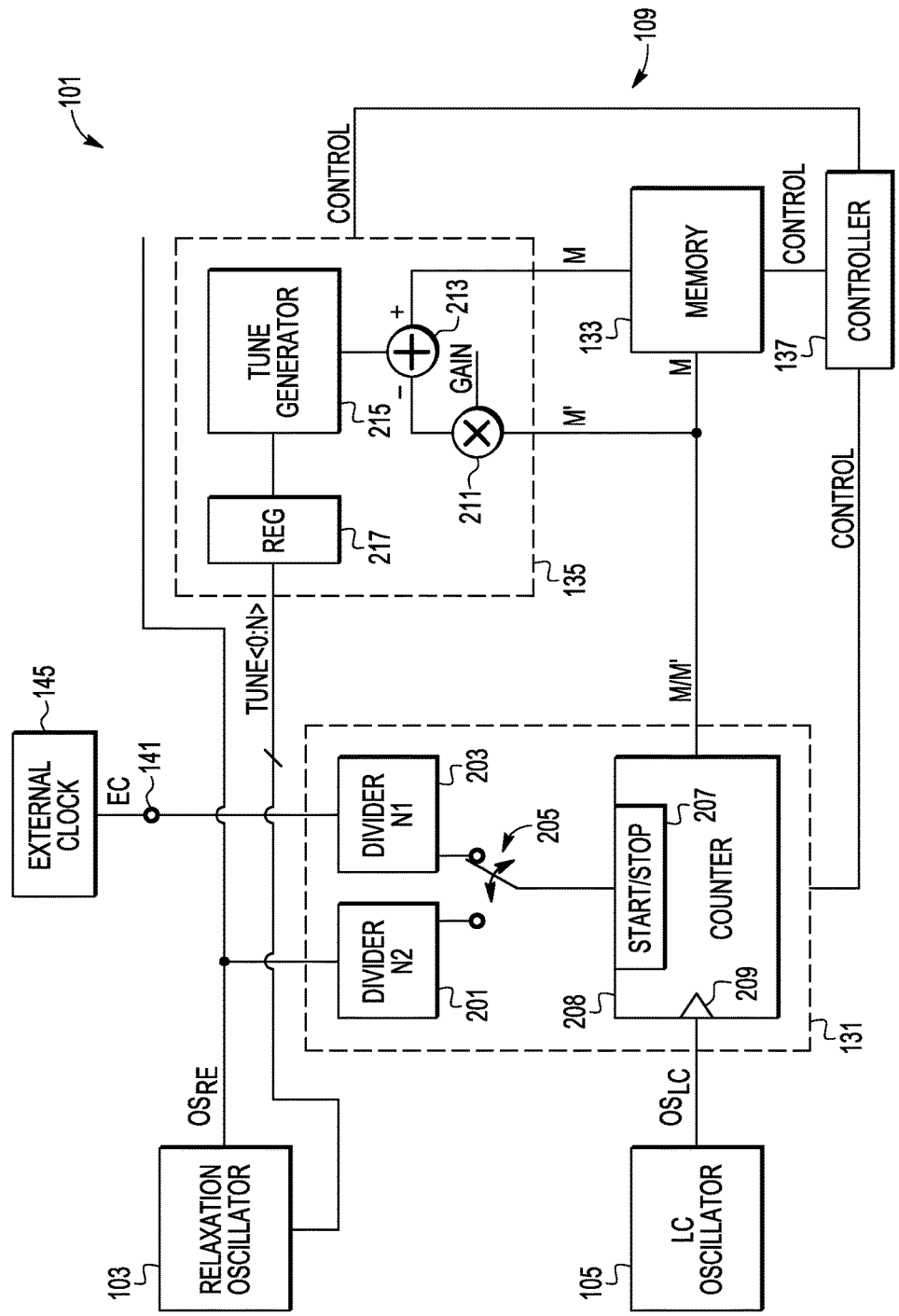
FIG. 2 is a circuit diagram of a system for providing an oscillator signal according to one embodiment of the present invention.

FIG. 2 is a circuit diagram of oscillator system 101 showing more detail of calibration system 109 according to one embodiment. In the embodiment shown, comparison circuit 131 includes a frequency divider 201 for dividing down the frequency ($F_{RE}$) of the output ($OS_{RE}$) of oscillator circuit 103, a frequency divider 203 for dividing down the frequency ($F_{EC}$) of the external clock signal, a switch 205, and a counter circuit 208. Counter circuit 208 includes start/stop logic 207 for starting and stopping the counting operation of counter circuit 208. Switch 205 is used to control which of the output of oscillator circuit 103 or the external clock signal (EC) is used to stop and start the counting operation of counter circuit 208. Counter circuit 208 includes a clock input 209 that is coupled to the output of oscillator circuit 105. The output count of counter circuit 208 provides a sampled value (M) during a sampling mode and a calibration value (M') during a calibration mode. In some embodiments, the count is an integer value and in others it can be a non integer value. During a sampling mode, the sampled value (M) is provided to memory 133 for storage under the control of controller 137. During a calibration mode, the calibration value (M') is provided to tuning circuit 135.

In the embodiment shown, tuning circuit 135 includes an input for receiving the calibration value (M') from counter circuit 208 and an input from receiving the sampled value (M) stored in memory 133. Tuning circuit 135 includes a multiplier 211 for multiplying the calibration value (M') by a Gain value (G). Tuning circuit 135 also includes a subtractor 213 that subtracts the sampled value (M) from the comparison value times the Gain value (M'*G). Tuning circuit 135 also includes a tune generator 215 that, based on the output of subtractor 213, sets the Tune value (tune <0:n>) to either increase the frequency or decrease the frequency of $OS_{RE}$. Tuning circuit 135 includes registers 217 that hold the Tune value set by tune generator 215. In one embodiment, registers 217 are powered from a different power domain that enable them to be powered when the rest of calibration system 109 is powered down. In some embodiments, tune generator 215 includes a nonvolatile memory (not shown) that includes an initial Tune value that can be set during design or programed during manufacture. If the memory is erasable, then the memory can be written with the desired tune value each time the calibration routine is completed and the final Tune value is set.

In one embodiment, the Gain value (G) is equal to $(N_1*F_{RE}(\text{desired}))/N_2*F_{EC})$. The Gain value is set such that $M'*G=M$ when $OS_{RE}$ is at the desired frequency ($F_{RE}$ (desired)). In the embodiment shown, the Gain value is based on the configuration of the calibration system 109, the frequency of the external clock, and on the divider values $N_2$ and $N_1$. In one embodiment, the values of $N_1$ and $N_2$ are in the range of ½ to 1/128, but may be of other values (e.g. integer or non integer) in other embodiments. Also in other embodiments, the Gain value may include a temperature dependent value that is based on a measured temperature to provide temperature compensation for the calibration process.

In the embodiment shown, calibration system 109 uses digital values for the sampled value and the comparison value and compares those values in the digital domain to provide a digital Tune value. In other embodiments, at least some values may be analog and/or at least some of the operations may be performed in the analog domain. For example, the output of the counter circuit and the sampled value in memory 133 may be converted to an analog value wherein subtractor 213 is replaced by a comparator. Also in some embodiments, the Tune value may be an analog signal that is applied to oscillator circuit 103. In still other embodiments, counter circuit 208 may be replaced with a charge pump whose final voltage value is indicative of a frequency comparison between oscillator circuit 105 and oscillator circuit 103 or external clock 145.

Figure 3:
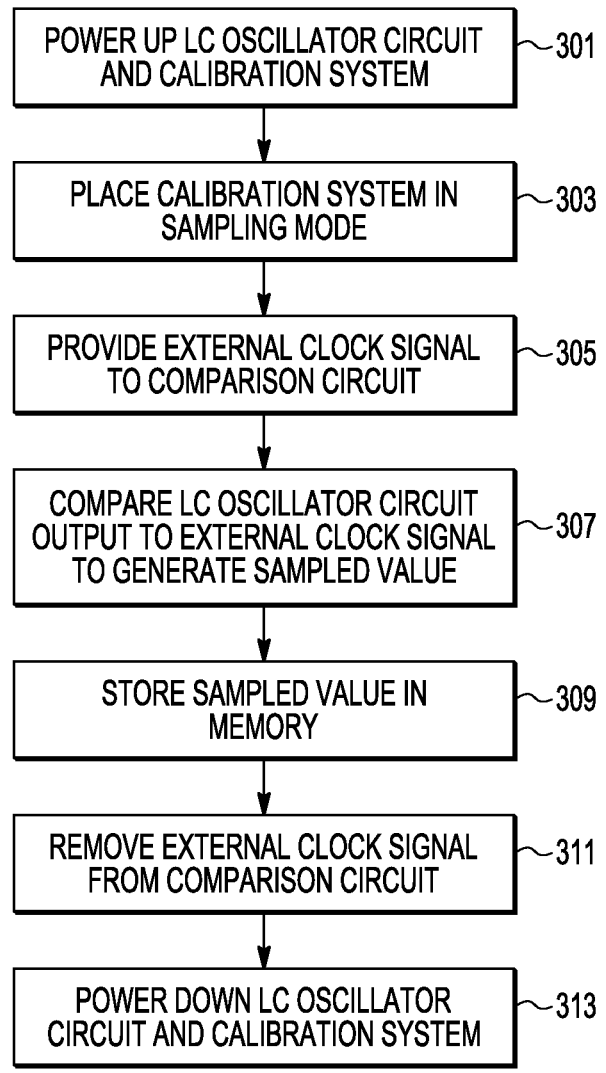
FIG. 3 is flow diagram of a sampling routine of a calibration system according to one embodiment of the present invention.

FIG. 3 sets forth a flow diagram of the operations of system 101 during a sampling routine according to one embodiment. In some embodiments, the sampling routine is performed during the manufacture of integrated circuit 100 (e.g. during wafer fabrication, after singulation, or before or after packaging) or during the manufacture of an electronic system incorporating integrated circuit 100. In one embodiment, the sampling routine is performed prior to wafer singulation. In other embodiments, the sampling routine is performed by an electronic system manufacturer who obtained the integrated circuit from an integrated circuit supplier. In still other embodiments, the sampling routine may be performed by an end user system for a single time or during multiple times over the life of the integrated circuit.

In operation 301, oscillator circuit 105 and system 109 are powered up. In operation 303, system 109 is placed in a sampling mode. In one embodiment, system 109 is placed in a sampling mode by signals supplied to controller 137 from an external control system (not shown) received from external terminals (not shown). In other embodiments, system 109 is placed in a sampling mode by signals from the integrated circuit controller (not shown) to controller 137. In some embodiments, the operations of controller 137 in the sampling mode are each controlled by an external testing system controller (not shown). In other embodiments, controller 137 may control the performance of the operations in the sampling mode as per an internal program upon a receipt of a signal to enter the sampling mode.

In operation 305, the external clock signal (EC) is provided to comparison circuit 131 via external terminal 141. Divider 203 divides the frequency ($F_{EC}$) of the external clock by a dividing factor $N_1$. In the sampling mode, controller 137 places switch 205 in a position to provide the divided external clock signal to start/stop logic 207.

In operation 307, the output ($OS_{LC}$) of oscillator circuit 105 is compared to the external clock signal (EC) to generate a sampled value (M). In one embodiment, the comparison is performed by counter circuit 208 counting the number of cycles of the output of oscillator circuit 105 during one cycle of the divided external clock signal. Start/stop logic 207 includes circuitry for starting the count on an edge of a divided external clock signal based on a signal from controller 137 and then stopping the count at the end of the cycle. The counter output (the sampled value (M)) is then stored in memory 133 in operation 309. Afterwards, the external clock is removed from terminal 141 and oscillator circuit 105 and system 109 are powered down in operation 313.

Figure 4:
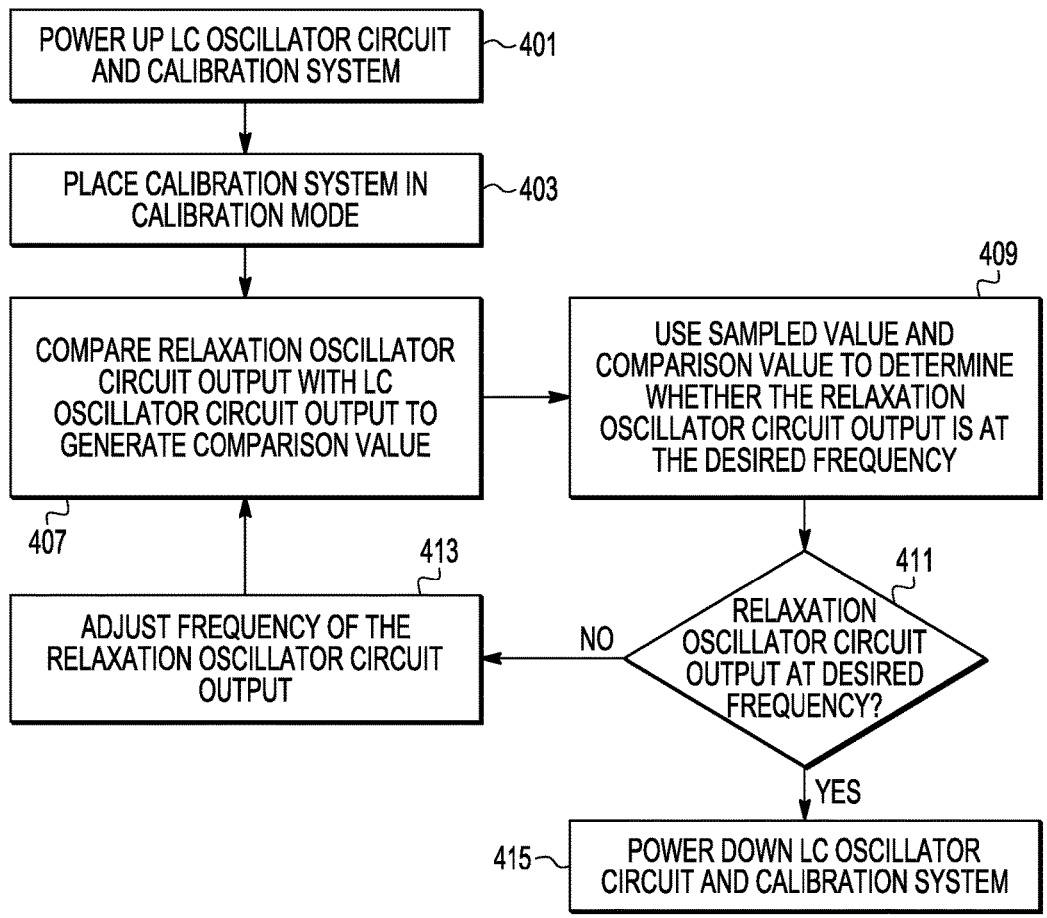
FIG. 4 is flow diagram of a calibration routine of a calibration system according to one embodiment of the present invention The use of the same reference symbols in different drawings indicates identical items unless otherwise noted. The Figures are not necessarily drawn to scale.

FIG. 4 sets forth a flow diagram of the operations of system 101 during a calibration routine according to one embodiment. Calibration routine can be performed at any time after the sampling routine to calibrate oscillator circuit 103. In one embodiment, calibration routine can be performed during manufacture of the integrated circuit or during manufacture of an electronic system incorporating the integrated circuit. In other embodiments, the calibration routine can be performed during the use of the electronic system incorporating the integrated circuit. For example, the routine may be performed during startup or power on reset. The routine can be performed periodically during use or in response to a change in temperature. Also, the routine may be performed as part of a diagnostic check in response to undesirable system performance.

In operation 401, oscillator circuit 105 and calibration system 109 are powered up. In operation 403, system 109 is placed in a calibration mode. In one embodiment, system 109 is placed in the calibration mode responsive to a signal sent to controller 137 from a system controller (not shown) or from a reset system (not shown). In calibration mode, controller 137 places switch 205 in a position to couple the output of divider 201 to the start/stop logic 207. Placing switch 205 is such a position provides a divided $OS_{RE}$ signal to the start/stop logic 207.

In operation 407, the output ($OS_{RE}$) of oscillator circuit 103 is compared with the output ($OS_{LC}$) of oscillator circuit 105 to generate a comparison value. In one embodiment, the comparison is performed by counter circuit 208 counting the number of cycles of the output of oscillator circuit 105 during one cycle of the divided output of oscillator circuit 103.

In operation 409, the sampled value and the comparison value are used to determine whether the output of oscillator circuit 103 is at the desired frequency. In one embodiment, the counter output (the comparison value (M')) is then provided to tuning circuit 135 where it is multiplied by a gain factor G and then subtracted from the sampled value (M). If the resultant value is a predetermined number (e.g. zero), then the output of oscillator circuit 103 is determined to be at the desired frequency and the Tune value <0:n> is not adjusted. If the output of oscillator circuit 103 is not at the desired frequency as determined in operation 409, then tune generator 215 adjusts the frequency of the output of oscillator circuit 103 in operation 413 by changing the Tune value. After the frequency of $OS_{RE}$ is adjusted in operation 413, compare operation 407 is performed again to generate a new comparison value with $OS_{RE}$ at the new adjusted frequency. In one embodiment, tune generator 215 adjusts the Tune value to either increase or decrease the frequency ($F_{RE}$) of $OS_{RE}$ in the desired direction. If the resultant number by subtractor 213 is higher than the predetermined number (e.g. a positive number), the frequency of $OS_{RE}$ is decreased. If the resultant number is lower than a predetermined number (e.g. a negative number), then the frequency of $OS_{RE}$ is increased. In some embodiments, the amount that the frequency of $OS_{RE}$ is increased or decreased depends upon the magnitude of the resultant value from subtractor 213.

The new comparison value generated by the second performance of operation 407 is then used with the sampled value in operation 409 to determine whether $OS_{RE}$ is at the desired frequency. If in operation 409 it is determined that $OS_{RE}$ is not at the desired frequency, then operations 407 and 409 are repeated until $OS_{RE}$ is determined to be at the desired frequency. Once $OS_{RE}$ is at the desired frequency, oscillator circuit 105 and calibration system 109 are powered down in operation 415. In some embodiments, registers 217 remain powered up to provide the Tune value that generated the desired frequency for $OS_{RE}$.

In some embodiments, the desired frequency of the output of oscillator circuit 103 is in a range of 1-10 MHz, but may be of other values in other embodiments. In some embodiments, the desired frequency of the external clock signal is in a range of 1-10 MHz, but may be of other values in other embodiments. The frequency of the external clock signal may be at the same frequency as $OS_{RE}$, in some embodiments, but may be at other frequencies in other embodiments. In some embodiments, the frequency of the output of oscillator circuit 105 is in the range of 1-3 GHz, but may be at other frequencies in other embodiments.

In one embodiment, having the output of LC oscillator circuit 105 be at a significantly higher frequency than the output of relaxation oscillator circuit 103 and the external clock signal may allow for a physically smaller LC tank circuit than with a lower frequency LC oscillator circuit. Although a higher frequency LC oscillator circuit consumes more power, the power disadvantage can be minimized by turning off the LC oscillator circuit 105 when not performing a calibration routine or sampling routine. Furthermore, utilizing a significantly higher $OS_{LC}$ allows for calibration system 109 to perform the sample routine and more importantly the calibration routine in a shorter period of time. However, in other embodiments, the output frequency of oscillator circuit 105 can be lower including lower than the frequency of oscillator circuit 103 or external clock. Also in other embodiment, the frequency of the $OS_{LC}$ can be divided down before being provided to clock circuit 208.

Furthermore, providing a higher frequency for oscillator circuit 105 may provide for a calibration system with a better resolution. In the embodiment of FIG. 2, the resolution of the system is equal to $F_{EC}/(N_1*F_{LC})$. As shown from the equation, utilizing frequency dividers ($N_1$ and $N_2$) also improves the resolution of the calibration system. Also, unitizing non-integer period counters may improve resolution as well.

As described herein, one embodiment includes a calibration system having a sampling mode where the output of a more frequency stable oscillator circuit is compared with an external clock to generate a sampled value and a calibration mode where the output of the more frequency stable oscillator circuit is compared to the output of an other oscillator circuit that is less frequency stable and/or more power efficient to tune the other oscillator with the sampled value. One advantage that may occur with such a system is that the less frequency stable and/or more power efficient oscillator circuit can be tuned over the life of the integrated circuit without the use of an external clock to provide an oscillator signal that meets a frequency accuracy requirement (e.g. accuracy within 0.1%) over the life of the integrated circuit.

Furthermore, in some embodiments, because the LC oscillator circuit 105 does not need to be trimmed or calibrated, an LC oscillator circuit with a relatively high frequency stability can be utilized.

Modifications may be made to the circuitry and methods described herein. For example, the output of oscillator circuit 105 can be provided to the start/stop logic 207 and switch 205 could be coupled to the clock input 209 of clock circuit 208. With such embodiments, the count produced by counter circuit 208 would be the number of cycles of the external clock signal or oscillator circuit 103 output during a cycle of the output of oscillator circuit 105. Also, either one or both of dividers 201 and 203 may be omitted. In addition, a single divider may be located between switch 205 and the input of the start/stop logic 207 where both the external clock frequency and the desired frequency of oscillator circuit 103 are the same.

In other embodiments, portions of the calibration system 109 may be programmable (either during manufacture and/or during system use) to change the frequency of oscillator circuit 103. For example, the divider value $N_2$ and/or Gain value (G) may be programmable, e.g. to change the frequency of oscillator circuit 103 during operation or for other reasons. Divider $N_1$ may be programmable e.g. to enable different frequencies of external clocks to be used or for other reasons. Also, multiple sampled values may be generated and stored in memory 133 during a sampling routine to enable oscillator circuit 103 to provide different frequencies in different operating modes of the integrated circuit.

In some embodiments, the divider circuits are physically located with switch 205 and counter circuit 208 on the integrated circuit. In other embodiments, they may be located at different locations of the integrated circuit. In other embodiments, counter circuit 208 may be configured to count the number of cycles of oscillator circuit 105 for more than one clock cycle of $OC_{RE}$ or the external clock signal.

In other embodiments, calibration system 109 may be used to calibrate more than one oscillator circuit 103 on an integrated circuit. In such an embodiment, switch 205 would be a multi-way switch that would be able to tune two (or more) different oscillator circuits similar to oscillator circuit 103. In some embodiments, LC oscillator circuit 105 could be used to provide a clocking signal to other circuitry during the operation of the integrated circuit. In other embodiments, different operations maybe performed during the sampling routine and/or the calibration routine. In some embodiments, the sampled value may be generated from another calibration system and stored in memory 133.

In one embodiment, a method for tuning an oscillator circuit includes comparing, with a comparison circuit, an output of a first oscillator circuit with an output of a second oscillator circuit to generate a comparison value. The comparison value is based on a frequency of the output of the first oscillator circuit and a frequency of the output of the second oscillator circuit. The method includes comparing the comparison value with a sampled value stored in memory. The sampled value was generated from a comparison with the comparison circuit of an output of the second oscillator circuit with an external clock signal. The method further includes providing a tune value to the first oscillator circuit to tune the frequency of the output the first oscillator circuit. The tune value is based on the comparing the comparison value with the sampled value.

In another embodiment, a circuit for providing a tuned oscillator signal includes a first oscillator circuit including an output to provide a first oscillator signal. The first oscillator circuit includes an input to receive a tuning value to tune a frequency of the first oscillator signal. The circuit includes a second oscillator circuit including an output to provide a second oscillator signal. The circuit includes a comparison circuit having a first input to receive the first oscillator signal, a second input to receive the second oscillator signal, and a third input to receive an external clock signal, the comparison circuit including an output to provide a comparison value indicative of a comparison of the second oscillator signal with the first oscillator signal and to provide a sampled value indicative of a comparison of the second oscillator signal with the external clock signal. The circuit includes a memory for storing the sampled value from the comparison circuit. The circuit includes a tuning circuit that receives the comparison value generated by the comparison circuit. The tuning circuit includes an output to provide the tuning value generated by the tuning circuit. The tuning value is based on a comparison of a comparison value and the sampled value from the memory.

In another embodiment, a method for tuning an oscillator circuit includes comparing, with a comparison circuit, an output of a first oscillator circuit with an output of a second oscillator circuit to generate a comparison value. The comparison value is based on a frequency of the output of the first oscillator circuit and a frequency of the output of the second oscillator circuit. The method includes comparing the comparison value with a value stored in memory. The value stored in memory was generated based on an external clock signal that is not coupled to the comparison circuit, the first oscillator circuit, or the second oscillator circuit during the comparing. The method includes providing a tune value to the first oscillator circuit to tune the frequency of the output the first oscillator circuit. The tune value is based on the comparing the comparison value with the value stored in memory.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for tuning an oscillator circuit, the method comprising:
   comparing, with a comparison circuit, an output of a first oscillator circuit with an output of a second oscillator circuit to generate a comparison value, the comparison value based on a frequency of the output of the first oscillator circuit and a frequency of the output of the second oscillator circuit;
   comparing the comparison value with a sampled value stored in memory, wherein the sampled value was generated from a comparison with the comparison circuit of an output of the second oscillator circuit with an external clock signal;
   providing a tune value to the first oscillator circuit to tune the frequency of the output the first oscillator circuit, the tune value based on the comparing the comparison value with the sampled value.

2. The method of claim 1 wherein the first oscillator circuit is characterized as a relaxation oscillator circuit.

3. The method of claim 1 wherein the second oscillator circuit is characterized as inductor capacitor (LC) based oscillator circuit.

4. The method of claim 1 wherein the second oscillator circuit is characterized as a more frequency stable oscillator circuit than the first oscillator circuit.

5. The method of claim 1 wherein the first oscillator circuit is characterized as a lower power consuming oscillator circuit than the second oscillator circuit.

6. The method of claim 1 further comprising:
   dividing down the frequency of the output of the first oscillator circuit prior to the comparing the output of a first oscillator circuit with the output of a second oscillator circuit.

7. The method of claim 1 wherein the comparing the output of a first oscillator circuit with the output of a second oscillator circuit to generate a comparison value includes generating a count with a counter indicative of a number of clock cycles of the output of the second oscillator circuit occurring during a period of time as determined by the output of the first oscillator circuit, wherein comparison value is indicative of the count.

8. The method of claim 7 wherein the sampled value is generated with the counter and is indicative of a number of clock cycles of the output of the second oscillator circuit occurring during a period of time as determined by the external clock signal.

9. The method of claim 1 wherein after the providing a tune value to the first oscillator circuit and the frequency of the output of the first oscillator circuit has been tuned based on the tune value, the method further comprising:
   comparing, with the comparison circuit, the output of a first oscillator circuit with the output of a second oscillator circuit to generate a second comparison value, the second comparison value based on the frequency of the output of the first oscillator circuit and the frequency of the output of the second oscillator circuit;
   comparing the second comparison value with the sampled value stored in memory;
   providing a second tune value to the first oscillator circuit to tune the frequency of the output the first oscillator circuit, the second tune value is based on the comparing the second comparison value with the sampled value.

10. The method of claim 1 wherein after the providing a tune value to the first oscillator circuit to tune the frequency of the output the first oscillator circuit, using the output of the first oscillator circuit as a clock signal for a circuit, wherein the second oscillator circuit is powered down at least during a portion of the using.

11. A circuit for providing a tuned oscillator signal, the circuit comprising:
   a first oscillator circuit including an output to provide a first oscillator signal, the first oscillator circuit includes an input to receive a tuning value to tune a frequency of the first oscillator signal;
   a second oscillator circuit including an output to provide a second oscillator signal;
   a comparison circuit having a first input to receive the first oscillator signal, a second input to receive the second oscillator signal, and a third input to receive an external clock signal, the comparison circuit including an output to provide a comparison value indicative of a comparison of the second oscillator signal with the first oscillator signal and to provide a sampled value indicative of a comparison of the second oscillator signal with the external clock signal;

a memory for storing the sampled value from the comparison circuit;

a tuning circuit that receives the comparison value generated by the comparison circuit, the tuning circuit including an output to provide the tuning value generated by the tuning circuit, the tuning value is based on a comparison of a comparison value and the sampled value from the memory.

12. The circuit of claim 11 wherein the comparison circuit includes a counter, the counter including an output to provide the comparison value indicative of a comparison of the second oscillator signal with the first oscillator signal and to provide the sampled value indicative of a comparison of the second oscillator signal with an external clock signal.

13. The circuit of claim 12 wherein the comparison value is indicative of a count by the counter of a number of clock cycles of the second oscillator signal occurring during a period of time as determined by the first oscillator signal.

14. The circuit of claim 12 wherein the sampled value is indicative of a count by the counter of a number of clock cycles of the second oscillator signal occurring during a period of time as determined by the external clock signal.

15. The circuit of claim 11 wherein the first oscillator circuit is characterized as a relaxation oscillator circuit.

16. The circuit of claim 11 wherein the second oscillator circuit is characterized as inductor capacitor (LC) based oscillator circuit.

17. The circuit of claim 11 wherein the second oscillator circuit is characterized as a more frequency stable oscillator circuit than the first oscillator circuit.

18. The circuit of claim 11 wherein the first oscillator circuit is characterized as a lower power consuming oscillator circuit than the second oscillator circuit.

19. The circuit of claim 11 wherein the comparison circuit further comprises a frequency divider coupled to receive the first oscillator signal and reduce the frequency of the first oscillator circuit for the comparison with the second oscillator signal.

20. A method for tuning an oscillator circuit, the method comprising:

comparing, with a comparison circuit, an output of a first oscillator circuit with an output of a second oscillator circuit to generate a comparison value, the comparison value based on a frequency of the output of the first oscillator circuit and a frequency of the output of the second oscillator circuit;

comparing the comparison value with a value stored in memory, wherein the value stored in memory was generated based on an external clock signal that is not coupled to the comparison circuit, the first oscillator circuit, or the second oscillator circuit during the comparing;

providing a tune value to the first oscillator circuit to tune the frequency of the output the first oscillator circuit, the tune value based on the comparing the comparison value with the value stored in memory.

\* \* \* \* \*